US010291973B2

(12) United States Patent
Lim et al.

(10) Patent No.: US 10,291,973 B2
(45) Date of Patent: May 14, 2019

(54) SENSOR DEVICE WITH INGRESS PROTECTION

(71) Applicant: Knowles Electronics, LLC, Itasca, IL (US)

(72) Inventors: Tony K. Lim, Naperville, IL (US); Norman Dennis Talag, Woodridge, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

(21) Appl. No.: 15/813,103

(22) Filed: Nov. 14, 2017

(65) Prior Publication Data

US 2018/0070162 A1  Mar. 8, 2018

Related U.S. Application Data

(63) Continuation-in-part of application No. 15/154,545, filed on May 13, 2016, now Pat. No. 9,883,270.
(Continued)

(51) Int. Cl.
*H04R 1/08* (2006.01)
*H04R 19/04* (2006.01)
(Continued)

(52) U.S. Cl.
CPC ............ *H04R 1/086* (2013.01); *G01L 9/0042* (2013.01); *H04R 1/04* (2013.01); *H04R 19/04* (2013.01); *H01L 2224/48091* (2013.01); *H01L 2224/48137* (2013.01); *H01L 2224/8592* (2013.01); *H01L 2924/00014* (2013.01);
(Continued)

(58) Field of Classification Search
CPC ... G16H 40/40; H01L 23/481; H01L 23/5389; H04R 11/023; H04R 11/086; H04R 1/023; H04R 1/086; H04R 1/04; H04R 19/04; H04R 1/02; B81B 7/0064
USPC ............... 257/415, 416, 704, 724, 678, 680; 348/14.02; 381/92, 174, 337, 360, 361, 381/26, 91, 111, 162, 173, 354, 355, 365, 381/369, 175; 607/60; 398/133; 438/51, 438/125; 205/777.5
See application file for complete search history.

(56) References Cited

U.S. PATENT DOCUMENTS 5,822,598 A  10/1998 Lam
6,070,140 A   5/2000 Tran
(Continued)

OTHER PUBLICATIONS

International Search Report and Written Opinion, PCT/US2016/032486, Knowles Electronics, LLC, 6 pages (dated Aug. 11, 2016).

*Primary Examiner* — Gerald Gauthier
(74) *Attorney, Agent, or Firm* — Foley & Lardner LLP

(57) ABSTRACT

A microphone includes a base and a microelectromechanical system (MEMS) die and an integrated circuit (IC) disposed on the base. The microphone also includes a cover mounted on the base and covering the MEMS die and the IC. The cover includes an indented region or an inwardly drawn region that define a top port through which acoustic energy can enter the microphone and be incident on the MEMS die. The microphone also includes a filtering material disposed on the top port on an outside surface of the cover and within the indented region or the inwardly drawn region. The filtering material provides resistance to ingression of solid particles or liquids into the microphone.

30 Claims, 9 Drawing Sheets

Related U.S. Application Data

(60) Provisional application No. 62/161,512, filed on May 14, 2015.

(51) Int. Cl.
 *G01L 9/00* (2006.01)
 *H04R 1/04* (2006.01)
 *H04R 19/00* (2006.01)
 *H04R 31/00* (2006.01)

(52) U.S. Cl.
 CPC .............. *H01L 2924/16151* (2013.01); *H01L 2924/16152* (2013.01); *H04R 19/005* (2013.01); *H04R 31/00* (2013.01); *H04R 2499/11* (2013.01)

(56) References Cited

U.S. PATENT DOCUMENTS

| | | | |
|---|---|---|---|
| 6,154,721 A | 11/2000 | Sonnic | |
| 6,249,757 B1 | 6/2001 | Cason | |
| 6,397,186 B1 | 5/2002 | Bush et al. | |
| 6,522,762 B1* | 2/2003 | Mullenborn | H04R 19/005 367/181 |
| 6,535,766 B1* | 3/2003 | Thompson | A61N 1/025 607/32 |
| 6,756,700 B2 | 6/2004 | Zeng | |
| 6,781,231 B2* | 8/2004 | Minervini | B81B 7/0064 257/704 |
| 7,118,668 B1* | 10/2006 | Edelbrock | C12Q 1/001 205/777.5 |
| 7,190,038 B2 | 3/2007 | Dehe et al. | |
| 7,415,416 B2 | 8/2008 | Rees | |
| 7,473,572 B2 | 1/2009 | Dehe et al. | |
| 7,774,204 B2 | 8/2010 | Mozer et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 7,957,972 B2 | 6/2011 | Huang et al. | |
| 8,275,148 B2 | 9/2012 | Li et al. | |
| 8,553,921 B2* | 10/2013 | Yao | H04R 19/04 381/174 |
| 8,617,934 B1* | 12/2013 | Minervini | H04R 19/016 257/704 |
| 8,666,751 B2 | 3/2014 | Murthi et al. | |
| 8,670,579 B2* | 3/2014 | Wu | B81B 7/0061 381/113 |
| 8,841,738 B2* | 9/2014 | Harney | H04R 1/086 257/416 |
| 8,972,252 B2 | 3/2015 | Hung et al. | |
| 8,996,381 B2 | 3/2015 | Mozer et al. | |
| 9,006,880 B1 | 4/2015 | Minervini | |
| 9,012,255 B1* | 4/2015 | Arunasalam | B81C 1/00309 438/51 |
| 9,043,211 B2 | 5/2015 | Haiut et al. | |
| 9,112,984 B2 | 8/2015 | Sejnoha et al. | |
| 9,338,560 B1* | 5/2016 | Minervini | B81B 7/0061 |
| 9,402,118 B2* | 7/2016 | Lim | H04R 1/02 |
| 9,725,303 B1* | 8/2017 | Maier | B81B 7/0064 |
| 9,794,661 B2* | 10/2017 | Watson | H04R 1/023 |
| 9,881,850 B2* | 1/2018 | Yu | H01L 23/481 |
| 9,883,270 B2* | 1/2018 | Lim | H04R 1/086 |
| 9,911,700 B2* | 3/2018 | Hurwitz | H01L 23/5389 |
| 10,167,188 B2 | 1/2019 | Agashe et al. | |
| 2002/0102004 A1* | 8/2002 | Minervini | B81B 7/0064 381/175 |
| 2005/0207605 A1 | 9/2005 | Dehe et al. | |
| 2005/0218488 A1* | 10/2005 | Matsuo | B81C 1/00095 257/678 |
| 2006/0074658 A1 | 4/2006 | Chadha | |
| 2006/0157841 A1* | 7/2006 | Minervini | H04R 19/04 257/680 |
| 2006/0237806 A1* | 10/2006 | Martin | B81C 1/00182 257/415 |
| 2007/0278501 A1 | 12/2007 | MacPherson et al. | |
| 2008/0128901 A1* | 6/2008 | Zurcher | B81C 1/00238 257/724 |
| 2008/0157301 A1 | 7/2008 | Ramakrishna et al. | |
| 2008/0175425 A1 | 7/2008 | Roberts et al. | |
| 2008/0247585 A1* | 10/2008 | Leidl | B81B 7/0061 381/360 |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0086146 A1* | 4/2010 | Gong | B81C 1/0023 381/91 |
| 2010/0128914 A1 | 5/2010 | Khenkin | |
| 2010/0175242 A1 | 7/2010 | Wu | |
| 2010/0183181 A1 | 7/2010 | Wang | |
| 2010/0246877 A1 | 9/2010 | Wang et al. | |
| 2010/0284553 A1* | 11/2010 | Conti | B81B 7/0061 381/174 |
| 2010/0290644 A1 | 11/2010 | Wu et al. | |
| 2010/0322443 A1 | 12/2010 | Wu et al. | |
| 2010/0322451 A1* | 12/2010 | Wu | H04R 1/086 381/369 |
| 2011/0013787 A1 | 1/2011 | Chang | |
| 2011/0075875 A1* | 3/2011 | Wu | B81C 1/0023 381/361 |
| 2011/0194857 A1* | 8/2011 | Avenson | H04R 23/008 398/133 |
| 2012/0175747 A1 | 7/2012 | Schlarmann et al. | |
| 2012/0189144 A1 | 7/2012 | Delaus et al. | |
| 2012/0232896 A1 | 9/2012 | Taleb et al. | |
| 2012/0237073 A1* | 9/2012 | Goida | H04R 1/02 381/361 |
| 2012/0310641 A1 | 12/2012 | Niemisto et al. | |
| 2012/0321111 A1 | 12/2012 | Lillelund | |
| 2013/0051586 A1 | 2/2013 | Stephanou et al. | |
| 2013/0140655 A1* | 6/2013 | Yeh | H01L 21/56 257/416 |
| 2013/0177180 A1 | 7/2013 | Bharatan et al. | |
| 2013/0223635 A1 | 8/2013 | Singer et al. | |
| 2013/0294622 A1* | 11/2013 | Kasai | H04R 19/005 381/162 |
| 2014/0010374 A1* | 1/2014 | Kasai | H04R 3/00 381/26 |
| 2014/0037120 A1 | 2/2014 | Lim et al. | |
| 2014/0072151 A1 | 3/2014 | Ochs et al. | |
| 2014/0117469 A1* | 5/2014 | Takahashi | B81C 1/0023 257/415 |
| 2014/0122078 A1 | 5/2014 | Joshi et al. | |
| 2014/0163978 A1 | 6/2014 | Basye et al. | |
| 2014/0169607 A1* | 6/2014 | Goida | H04R 1/021 381/365 |
| 2014/0183671 A1 | 7/2014 | Kuratani | |
| 2014/0233782 A1 | 8/2014 | Bolognia et al. | |
| 2014/0244269 A1 | 8/2014 | Tokutake | |
| 2014/0246738 A1 | 9/2014 | Protheroe et al. | |
| 2014/0246739 A1 | 9/2014 | Protheroe et al. | |
| 2014/0257821 A1 | 9/2014 | Adams et al. | |
| 2014/0274203 A1 | 9/2014 | Ganong et al. | |
| 2014/0278435 A1 | 9/2014 | Ganong et al. | |
| 2014/0281628 A1 | 9/2014 | Nigam et al. | |
| 2014/0291784 A1 | 10/2014 | Conklin | |
| 2014/0294209 A1* | 10/2014 | Szczech | H04R 1/086 381/173 |
| 2014/0294218 A1* | 10/2014 | Suvanto | H04M 1/03 381/337 |
| 2014/0343949 A1 | 11/2014 | Huang et al. | |
| 2014/0355784 A1* | 12/2014 | Han | H04R 1/406 381/92 |
| 2015/0001649 A1 | 1/2015 | Harrington | |
| 2015/0061045 A1 | 3/2015 | Fuergut et al. | |

(56) References Cited

U.S. PATENT DOCUMENTS

| | | |
|---|---|---|
| 2015/0061048 A1* | 3/2015 | Escher-Poeppel ..... H04R 1/021 |
| | | 257/416 |
| 2015/0106085 A1 | 4/2015 | Lindahl |
| 2015/0112690 A1 | 4/2015 | Guha et al. |
| 2015/0134331 A1 | 5/2015 | Millet et al. |
| 2015/0189443 A1* | 7/2015 | Wang .................... H04R 19/005 |
| | | 381/173 |
| 2015/0189446 A1* | 7/2015 | Wang .................... H04R 19/04 |
| | | 381/174 |
| 2015/0195659 A1* | 7/2015 | Szczech ............... H04R 19/005 |
| | | 381/174 |
| 2015/0237429 A1* | 8/2015 | Ryan ...................... H04R 1/086 |
| | | 381/174 |
| 2015/0237431 A1* | 8/2015 | Jeziorek ................ H04R 1/086 |
| | | 381/361 |
| 2015/0251898 A1 | 9/2015 | Vos et al. |
| 2015/0304753 A1* | 10/2015 | Loeppert .................. H04R 1/04 |
| | | 381/111 |
| 2016/0071506 A1* | 3/2016 | Qutub ...................... H04R 1/08 |
| | | 381/354 |
| 2016/0100256 A1 | 4/2016 | Watson et al. |
| 2016/0205463 A1* | 7/2016 | Szczech ................ H04R 1/086 |
| | | 381/111 |
| 2016/0229689 A1 | 8/2016 | Kaanta et al. |
| 2016/0261941 A1* | 9/2016 | Brioschi ............... B81B 7/0058 |
| 2016/0337735 A1* | 11/2016 | Linn ...................... H04R 1/086 |
| 2017/0260043 A1 | 9/2017 | Lin et al. |
| 2018/0070158 A1* | 3/2018 | Watson .................. H04R 17/02 |
| 2018/0070162 A1* | 3/2018 | Lim ....................... H04R 1/086 |

* cited by examiner

SENSOR DEVICE WITH INGRESS PROTECTION

CROSS-REFERENCE TO RELATED APPLICATIONS

This application is a continuation-in-part of U.S. patent application Ser. No. 15/154,545, filed May 13, 2016, which application claims the benefit of and priority to U.S. Provisional Application No. 62/161,512, filed May 14, 2015. The subject matter of the aforementioned applications are incorporated herein by reference in their entirety.

BACKGROUND

In a microelectromechanical system (MEMS) microphone, a MEMS die includes at least one diaphragm and at least one back plate. The MEMS die is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. Microphones are deployed in various types of devices such as personal computers, cellular phones, mobile devices, headsets, and hearing aid devices.

SUMMARY

In an aspect of the disclosure, a sensor includes a base having a first surface and an opposing second surface. The sensor further includes a microelectromechanical system (MEMS) die mounted to the first surface of the base. The sensor also includes an integrated circuit disposed on the base. The sensor further includes a cover disposed over the first surface of the base covering the MEMS transducer and the IC, the cover having an outer surface and an inner surface, the outer surface of the cover defining an indented region having an indented surface, the cover defining a top port extending between the indented surface and the inner surface. The sensor additionally includes a filtering material disposed on the indented surface covering the top port, the filtering material structured to prevent ingress of contaminants through the top port.

In an aspect of the disclosure, a sensor includes a base having a first surface and an opposing second surface, a microelectromechanical system (MEMS) die mounted to the first surface of the base, and an integrated circuit disposed on the base. The sensor further includes a cover disposed over the first surface of the base covering the MEMS transducer and the IC, the cover having an outer surface and an inner surface, the cover further defining an inwardly drawn region forming a depression in the cover, the inwardly drawn region defining a top port. The sensor also includes a filtering material disposed in the inwardly drawn region and covering the top port, the filtering material structured to prevent ingress of contaminants through the top port.

In an aspect of the disclosure, a sensor includes a base having a first surface and an opposing second surface, a microelectromechanical system (MEMS) die mounted to the first surface of the base, and an integrated circuit disposed on the base. The sensor further includes a cover disposed over the first surface of the base covering the MEMS transducer and the IC, the cover having bottom surface facing the base, the bottom surface of the cover defining an indented portion, the cover defining a top port within the indented portion. The sensor also includes a mesh screen disposed within the indented portion and positioned to cover the top port, the mesh screen structured to prevent ingress of particles through the top port.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

For a more complete understanding of the disclosure, reference should be made to the following detailed description and accompanying drawings.

Figure 1:
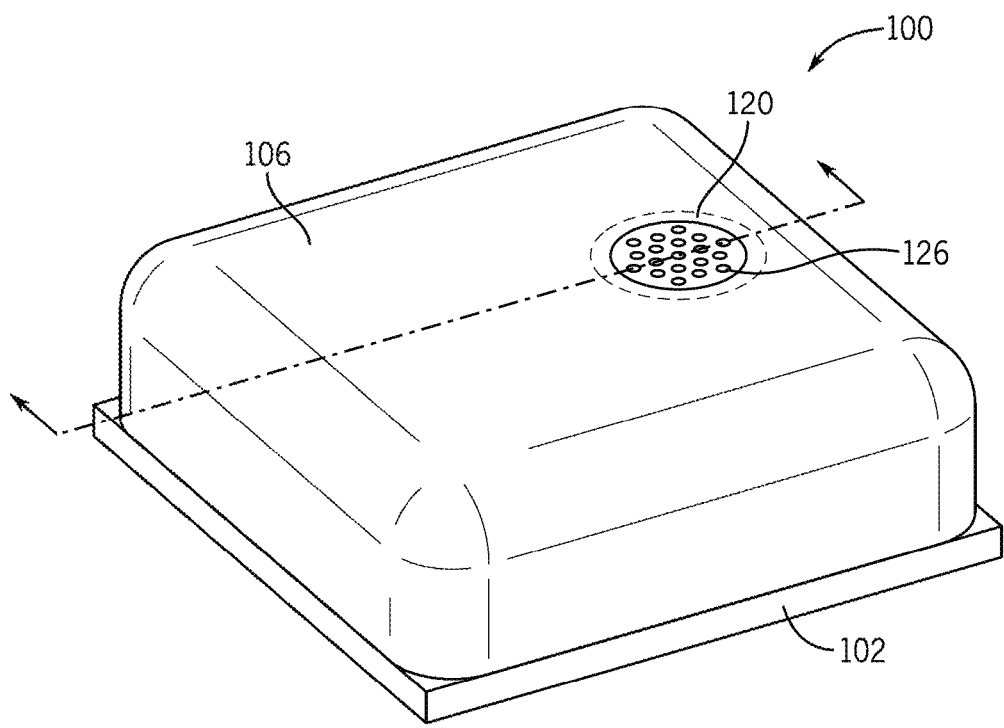
FIG. 1 is a perspective view of a top port microphone with a coined area in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. In the drawings, similar symbols typically identify similar components, unless context dictates otherwise.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Different types of acoustic devices have been used through the years. One type of device is a microphone. In a microelectromechanical system (MEMS) microphone, a MEMS die includes a diaphragm and a back plate. The MEMS die is supported by a substrate or base, and enclosed by a cover or a lid (with walls). A port may extend through the top of the housing (for a top port device) or through the base or substrate (for a bottom port device). Sound energy traverses through the port, moves the diaphragm and creates a changing potential with the back plate, which creates an electrical signal. Microphones are deployed in various types of devices such as personal computers or cellular phones. The structures disclosed herein can also be used in related sensors, such as pressure sensors, sensors designed to detect non-audible frequencies such as ultrasonic, and multi-functional sensors that include the ability to detect pressure, gas, humidity or temperature.

In a top port device, the port is formed through the cover or lid of the microphone. The lid is typically constructed of a metal. Drilling the port is expensive. Mechanical punching through the entire cover is a lower cost alternative. Unfortunately, sound inlets of 400 μm or less are difficult to be formed through low cost mechanical punching processes. However, usage of laser drills or other drilling means are expensive.

Additionally, space or volume is at a premium within microphones because microphones are often desired to have dimensions that are as small as possible. Unfortunately, this can create microphones without adequate space for internal components. For example, the lack of adequate space may result in connecting wires touching the conductive lid and possibly shorting to the lid or otherwise damaging the wire. Further, mesh is sometimes used over a port, but this also may create problems if the internal space is not adequate. As a result of concerns regarding space, previous approaches have had to otherwise increase microphone height (or other dimensions), which is undesirable in many applications where small microphones are desired.

In various embodiments described herein, a coined or indented area associated with the port in a microphone is used. In one example, an area of the lid or cover is punched out for a MEMS top port microphone. Small holes can be drilled through the remaining portion of the lid or cover. In another aspect, the hole is a relatively wide opening and a mesh screen is placed within the opening or extends just a little bit out of the hole. In still another aspect, indentation allows the lowering of the lid or cover because the indentation creates additional spacing between connecting wires and the lid or cover.

In many of these embodiments, a microphone includes a base and a MEMS die and an integrated circuit are disposed on the base. A cover or lid is coupled to the base and encloses the MEMS die and the integrated circuit within a cavity. The cover or lid has an inner surface in communication with the cavity, and the inner surface of the cover or lid has an indented or coined portion extending into but not fully through the cover or lid.

In some examples, the microphone is a top port microphone where at least one opening extends through the cover or lid and communicates with the indented portion. At least one opening can be a plurality of openings (e.g., configured to prevent ingress of contaminants) or a single opening (that does not prevent the ingress of contaminants). In other examples, the microphone is a bottom port device where a port extends through the base and communicates with the MEMS die within the cavity.

In some embodiments, a mesh screen is disposed at least partially in the indented portion. In some examples, the mesh screen is completely disposed in the indented portion, and in other examples the mesh screen extends out of the indented portion.

In some embodiments, the indented portion has rounded edges communicating the cover or lid. In other embodiments, the indented portion gives a greater freedom of movement and space for the wires coupling the integrated circuit to the MEMS device. The added space helps prevent damage to the wires or shorting of the wires to the conductive lid if the wires were to brush or impact the cover.

The present disclosure describes devices and techniques for improving the robustness of microphone devices, such as those incorporating MEMS transducers. In particular, the devices and techniques described in the present disclosure improve the resistance of a microphone package to ingression of solid particles and liquids. In some implementations, the present disclosure may provide for improved resistance to particle ingression with little or no impact to the signal-to-noise ratio (SNR) of the microphone device.

In one or more embodiments, the microphone package can include a base over which a MEMS transducer and an integrated circuit (IC) are disposed. A cover is attached to the based such that the cover encloses the MEMS transducer and the IC to define a front volume. The cover can include a top port through which acoustic energy can enter the microphone package and be incident on the MEMS transducer. The top port can be covered with a filtering structure or material that is acoustically permeable, but obstructs the passage of solid particles or liquids from entering the microphone package. In some embodiments, the filtering material is a mesh material. The mesh can be disposed on the outside of the microphone package, and in particular, on an outer surface of the cover. The cover can include indentations or inwardly drawn regions that support the mesh. In some embodiments, the indentations or the inwardly drawn regions can have depths that are substantially the same as a thickness of the mesh, such that a surface of the mesh is approximately flush with a surface of the cover. In some embodiments, the depths of the indentation or the inwardly drawn region can be greater than the thickness of the mesh.

Figure 2:
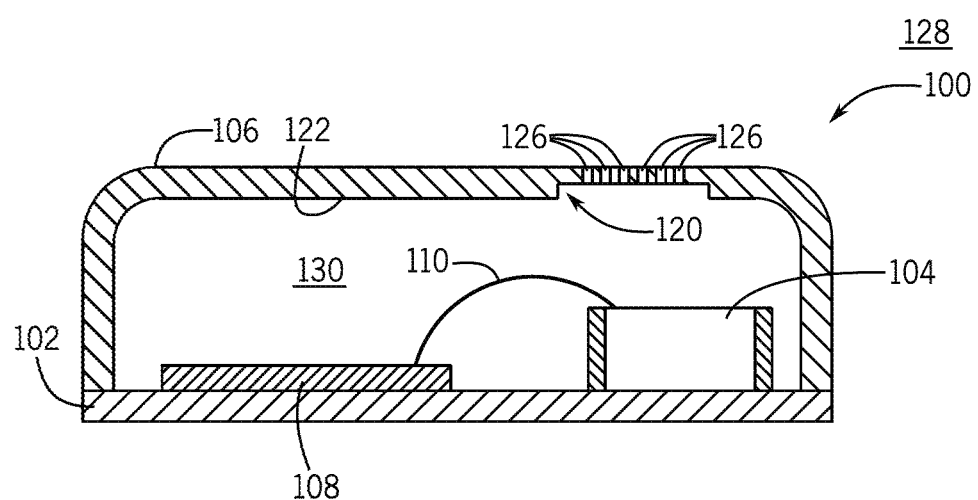
FIG. 2 is a side cutaway view of the top port microphone of FIG. 1 in accordance with an illustrative embodiment.

FIG. 1 is a perspective view of a top port microphone with a coined area in accordance with an illustrative embodiment. FIG. 2 is a side cutaway view of the top port microphone of FIG. 1 in accordance with an illustrative embodiment. One example of a micro electro mechanical system (MEMS) top port microphone 100 has a coined or indented thickness in the cover (or housing) that forms a coined or indented volume. The MEMS microphone 100 includes a base 102, a MEMS die 104 (including a diaphragm and a back plate), a cover 106, and an integrated circuit 108, and wires 110 connecting the integrated circuit 108 and MEMS die 104. A coined or indented volume 120 extends into the bottom surface 122 of the cover 106. A plurality of openings 126 extend through the remainder of the thickness of the cover allowing communication between the exterior 128 of the microphone and a front volume 130 of the microphone 100.

The cover 106 in the embodiment shown in FIGS. 1 and 2 is a one-piece metal cup or can that couples to the base 102. However, it will be appreciated that the cover 106 may also be a flat lid that couples to walls, and the walls couple to the base 102. The base 102 may be a printed circuit board in one example. In alternative embodiments, any suitable arrangement may be used.

The coined or indented volume 120 may be formed by a punching processes that indents the cover 106. The volume 120 does not extend completely through the cover 106.

In one example of the operation of the microphone of FIGS. 1 and 2, sound energy traverses through the plurality of openings 126 (which may be laser drilled in one example) and then through the indented volume 120, through the front volume 130, to the MEMS die 104. The sound energy moves the diaphragm of the MEMS die 104, and creates a changing potential with the back plate of the MEMS die 104, which creates an electrical signal. The electrical signal is sent to the integrated circuit 108. The integrated circuit 108 (which may be an application specific integrated circuit (ASIC) in some examples) may further process the signal (e.g., remove noise from the signal, convert the analog signal to a digital signal, etc.). The processed signal may be sent through the base 102 to pads on the base 102, which can be coupled to customer electronics.

In some embodiments, the coined or indented volume 120 provides ingression protection for the microphone 100. For example, the openings 126 prevent particulate or other types of contaminants from moving from the exterior of the microphone 100 to the interior of the microphone 100. That is, the openings 126 can allow the acoustic energy to pass through the openings 126, but do not allow most particulates or other other contaminants to enter into the front volume 130

By indenting the cover 106 to form the indented volume 120, more space is provided on inside front volume 130 for the wire 110 to move. The section of the metal housing or cover 106 that is coined allows more space for wire movement. The thickness of the metal housing is additionally reduced for lower manufacturing costs because this approach reduces manufacturing the costs of drilling the openings 126 through the entire thickness of the metal can 106.

Figure 3:
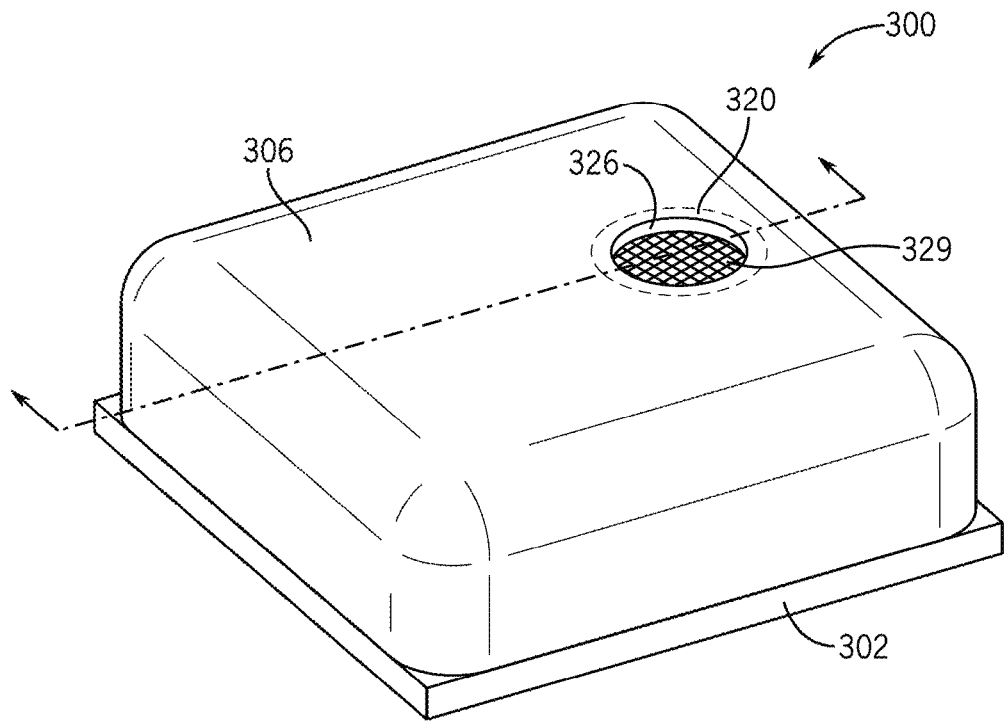
FIG. 3 is a perspective view of a top port microphone with coined area and screen in accordance with an illustrative embodiment.
Figure 4:
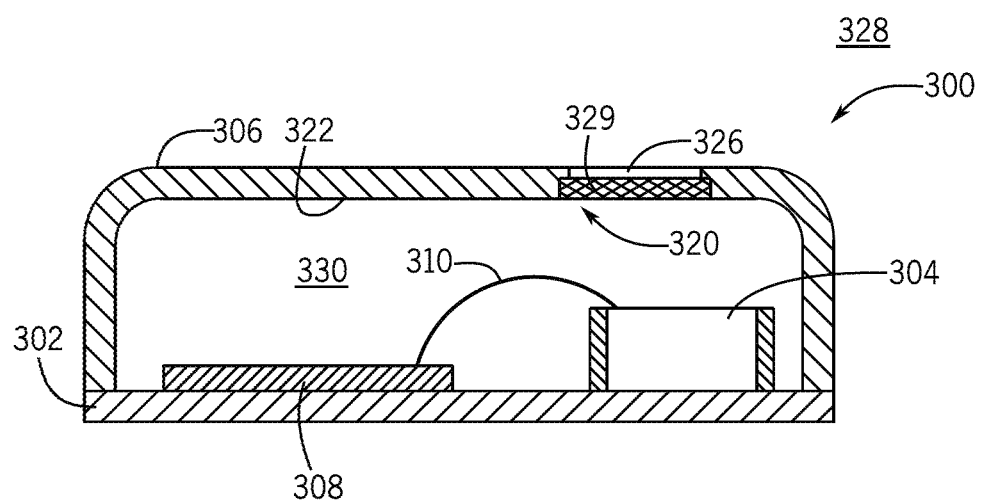
FIG. 4 is a side cutaway view of the top port microphone of FIG. 3 in accordance with an illustrative embodiment.

FIG. 3 is a perspective view of a top port microphone with coined area and screen in accordance with an illustrative embodiment. FIG. 4 is a side cutaway view of the top port microphone of FIG. 3 in accordance with an illustrative embodiment. FIG. 3 and FIG. 4 illustrate an approach that accommodates the use of thicker mesh with little or no intrusion into the metal can cavity (front volume). This approach provides for more space and lower stack-up of the chip assembly.

Embodiments shown in FIG. 3 and FIG. 4 include a MEMS top port microphone 300 with a coined or indented thickness in the cover (or housing) that forms a coined or indented volume in the cover. The MEMS microphone 300 includes a base 302, a MEMS die 304 (including a diaphragm and a back plate), a cover 306, and an integrated circuit 308, wires 310 connecting the integrated circuit 308 and MEMS die 304. A coined or indented volume 320 extends into the bottom surface 322 of the cover 306. A single opening 326 extend through the remainder of the thickness of the cover allowing communication between the exterior 328 of the microphone and a front volume 330 of the microphone 300. A mesh 329 extends across the coined or indented volume 130. In one example, the mesh 329 is flush with the surface 322. In another example it extends slightly beyond the surface 322. The mesh 329 may be a metal screen with small openings or a porous membrane that allows the passage of sound but prevents the passage of contaminants (e.g., solid, liquid, or gas) between the exterior of the microphone 300 to the interior of the microphone 300.

In the embodiment illustrated in FIG. 4, the cover 306 is a one-piece metal cup or can that couples to the base 302. In alternative embodiments, the cover 306 may be a flat lid that couples to walls, and the walls couple to the base 302. In an illustrative embodiment, the base 302 is a printed circuit board. In an illustrative embodiment, the coined or indented volume 320 is formed by a punching processes that indents the cover 306. The volume 320 does not extend completely through the cover 306.

In one example of the operation of the microphone of FIGS. 3 and 4, sound energy travels through the opening 326 (which may be drilled in one example) and then through the indented volume 320, through mesh 329, through the front volume 330, and to the MEMS die 304. The sound energy moves the diaphragm of the MEMS die 304, and creates a changing potential with the back plate of the MEMS die 304, which creates an electrical signal. The electrical signal is sent to the integrated circuit 308. The integrated circuit 308 (which may be an ASIC in some examples) may further process the signal (e.g., remove noise from the signal, boost the signal, etc.). The processed signal may be sent through the base 302 to pads on the base 302, which can be coupled or connected to customer electronics.

Figure 5:
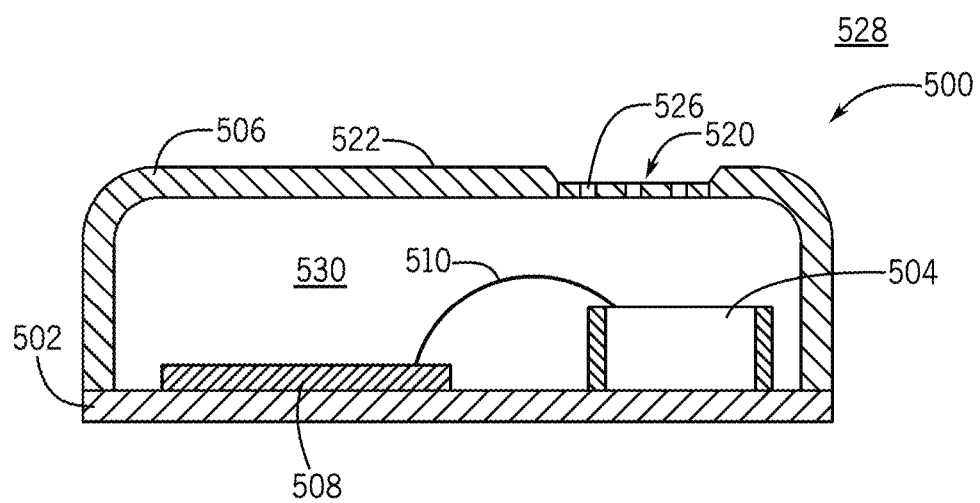
FIG. 5 is a side cut-away view of a top port microphone with the coined area on the top surface of the lid in accordance with an illustrative embodiment.

FIG. 5 is a side cut-away view of a top port microphone with the coined area on the top surface of the lid in accordance with an illustrative embodiment. The top port microphone 500 has the coined volume on the exterior of the cover. The MEMS microphone 500 includes a base 502, a MEMS die 504 (including a diaphragm and a back plate), a cover 506, an integrated circuit 508, and wires 510 connecting the integrated circuit 508 and MEMS die 504. A coined or indented volume 520 extends into the top surface 522 of the cover 506. In the embodiment shown in FIG. 5, a plurality of openings 526 extend through the remainder of the thickness of the cover allowing communication between the exterior 528 of the microphone and a front volume 530 of the microphone 500. In alternative embodiments, a screen may be used, similar to the embodiment shown in FIGS. 3 and 4.

In the embodiment shown in FIG. 5, the cover 506 is a one-piece metal cup or can that couples to the base 502. In alternative embodiments, the cover 506 may be a flat lid that couples to walls, and the walls couple to the base 502. The base 502 may be a printed circuit board. In an illustrative embodiment, the coined or indented volume 520 may be formed by a punching processes that indents the cover 506. The volume 520 does not extend completely through the cover 506.

In one example of the operation of the microphone of FIG. 5, sound energy traverses through the indented front volume 520, through the plurality of openings 526 (which may be laser drilled in one example), through the front volume 530, and to the MEMS die 504. The sound energy moves the diaphragm of the MEMS die 504, and creates a changing potential with the back plate of the MEMS die 504, which creates an electrical signal. The electrical signal is sent to the integrated circuit 508. The integrated circuit 508 (which may be an ASIC in some examples) may further process the signal (e.g., remove noise from the signal). The processed signal may be sent through the base 502 and to pads on the base 502, which may be coupled to customer electronics.

Figure 6:
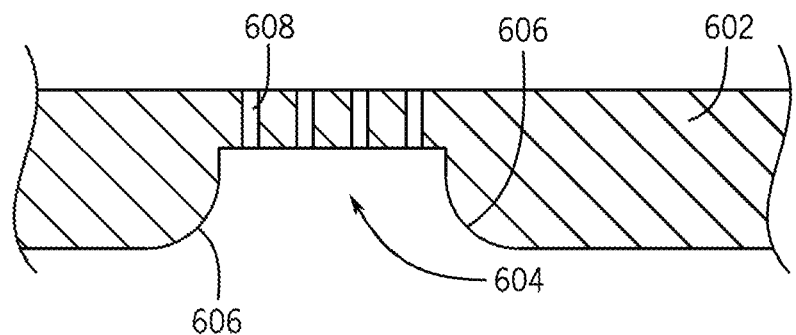
FIG. 6 is a close-up side view of a coined area when constructed by punching in accordance with an illustrative embodiment.

FIG. 6 is a close-up side view of a coined area when constructed by punching in accordance with an illustrative embodiment. A cover or lid 602 includes a coined or indented volume 604, which is created using a punching process where a punching tool is forced into the cover or lid 602. The force compresses the material of the lid to create the indented volume 604. Curved lip portions 606 surround and define the indented volume 604. The holes 608 may be bored through the cover or lid 602 (e.g., for a top port device) or may be omitted (e.g., for a bottom port device).

Figure 7:
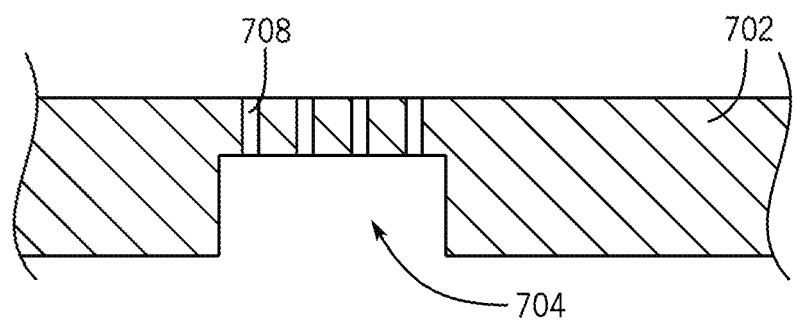
FIG. 7 is a close-up side view of a coined area when drilled in accordance with an illustrative embodiment.

FIG. 7 is a close-up side view of a coined area when drilled in accordance with an illustrative embodiment. A cover or lid 702 includes a coined or indented volume 704, which is created using a drill that bores into the cover or lid 702. The lip portion 706 surround and define the indented volume 704 and the lip portion 706 is perpendicular or approximately perpendicular with the surface of the cover or lid 702. The holes 708 may be bored through the lid 702 (e.g., for a top port device) or may be omitted (e.g., for a bottom port device).

Figure 8:
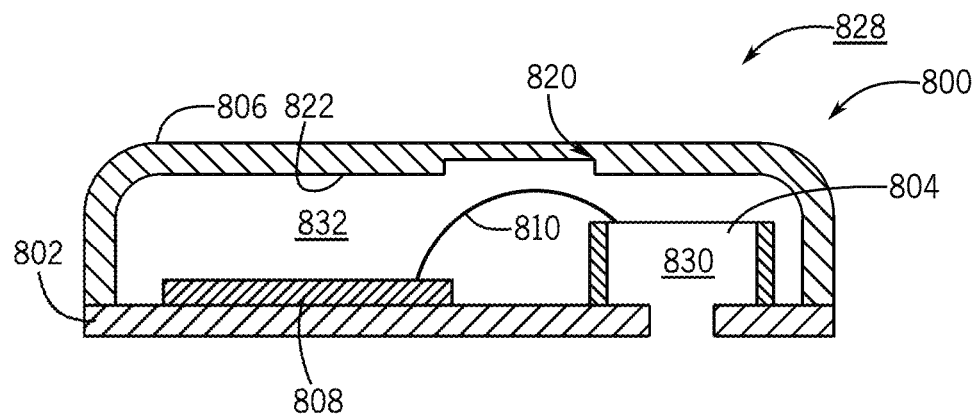
FIG. 8 is a side cut-away view of a bottom port microphone in accordance with an illustrative embodiment.

FIG. 8 is a side cut-away view of a bottom port microphone in accordance with an illustrative embodiment. A micro electro mechanical system (MEMS) bottom port microphone 800 has a coined or indented thickness in the cover (or housing). The MEMS microphone 800 includes a base 802, a MEMS die 804 (including a diaphragm and a back plate), a cover 806, an integrated circuit 808, and wires 810 connecting the integrated circuit 808 and MEMS die 804. A coined or indented volume 820 extends into the bottom surface 822 of the cover 806. A port 826 extends through the base 802. A front volume 830 communicates with the bottom port. A back volume 832 communicates with the indented volume 820.

In the embodiment shown in FIG. 8, the cover 806 is a one-piece metal cup or can that couples to the base 802. In alternative embodiments, the cover 806 may be a flat lid that couples to walls, and the walls couple to the base 802. The base 802 may be a printed circuit board. The coined or indented volume 820 may be formed by a punching processes that indents the cover 806. The volume 820 does not extend completely through the cover 806.

In one example of the operation of the microphone of FIG. 8, sound energy traverses through a port in the base 802 to front volume 830 in the MEMS die 804. The sound energy moves the diaphragm of the MEMS die 804, and creates a changing potential with the back plate of the MEMS die 804, which creates an electrical signal, which is sent to the integrated circuit 808. The integrated circuit 808 (which may be an ASIC in some examples) may further process the signal. The processed signal may be sent through the base 802 to pads on the base 802, which may be coupled to customer electronics.

Advantageously, more space is provided for the back volume 832 for the wire 810 to move. In other words, the section of the metal housing or cover 806 that is coined or indented provides more space for wire movement. Additionally, the indented volume 820 provides for a larger back volume 832, which may produce performance (e.g., sensitivity) improvements for the microphone 800. In some embodiments, the indented volume 820 can allow the height of the microphone 800 to be less (e.g., the distance between the surface 822 and the base 802) because the wire 810 can extend into the indented volume 820.

Figure 9:
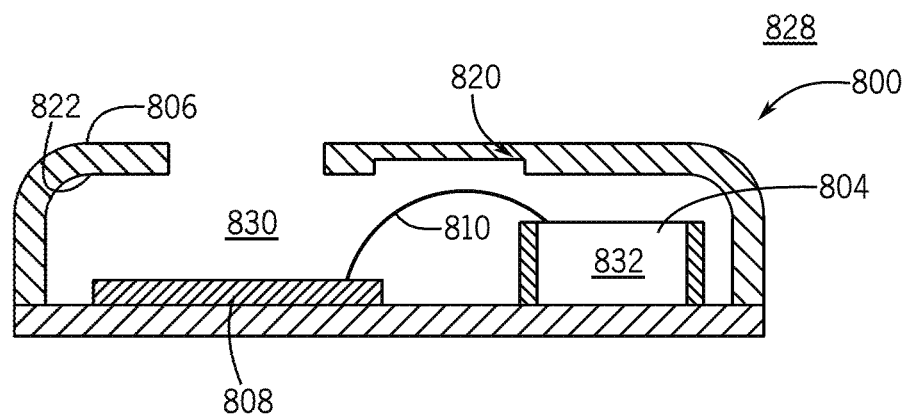
FIG. 9 is a side cut-away view of a top port microphone in accordance with an illustrative embodiment.

FIG. 9 is a side cut-away view of a top port microphone in accordance with an illustrative embodiment. In the embodiment shown in FIG. 9, sound energy travels through a port in the lid 806 and through the front volume 830. The sound energy causes the diaphragm of the MEMS die 804 to move. The MEMS die 804 surrounds the back volume 832. The embodiment of FIGS. 8 and 9 show that an indented portion such as the indented portion 820 can be used in any suitable microphone (or other suitable device). In an illustrative embodiment, the indented portion 820 can provide space or room for the wires 810 (e.g., for added movement space without shorting to the lid 806). For example, embodiments shown in FIGS. 1-5 can include one or more indented portions such as the indented portion 820. The additional indented portions can allow wires within the microphones to freely move around without compromising the functioning of the microphone. In an illustrative embodiment, an indented portion can function to allow the wires to move and function as a sound port.

Figure 10:
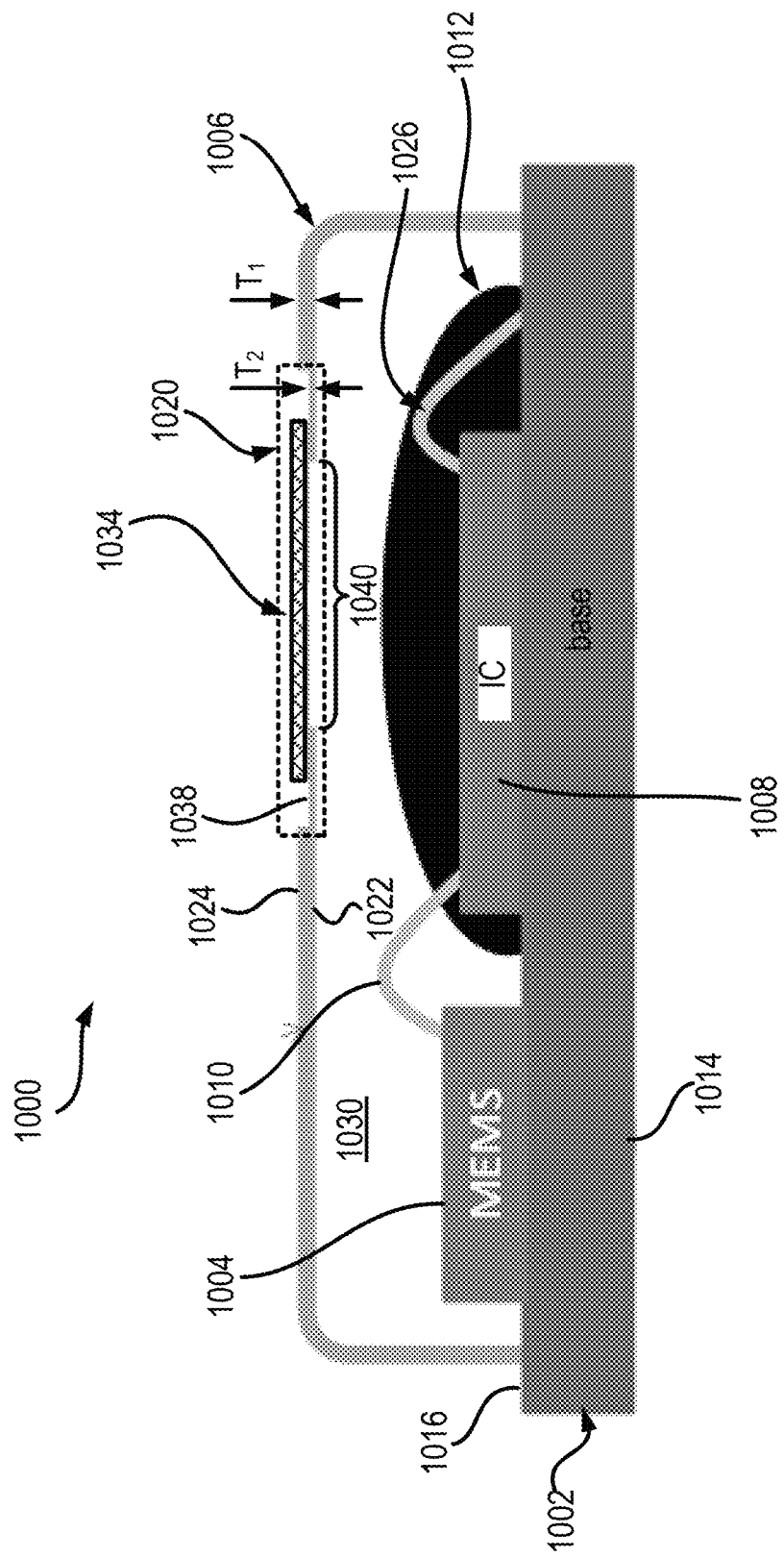
FIG. 10 shows a cut-away view of a top port sensor with a mesh positioned within a coined area on a top surface of a lid in accordance with an illustrative embodiment.

FIG. 10 shows a cut-away view of a top port sensor 1000 with a filtering material positioned within a coined area on a top surface of a lid in accordance with an illustrative embodiment. The top port sensor 1000 includes a substrate or a base 1002 having a first surface ("front surface") 1016 and a second surface ("back surface") 1014. A MEMS die 1004 and an IC 1008 are positioned on the front surface 1016 of the base 1002. A first set of wires 1010 connect the MEMS die 1004 to the IC 1008, and a second set of wires 1026 connect the IC 1008 to the base 1002. Optionally, in some embodiments, an encapsulating material 1012 at least partially covers the IC 1008 and the second set of wires 1026. In some implementations, the encapsulating material 1012 can entirely cover the IC 1008 and the second set of wires 1026. The encapsulating material 1012 can include an insulating material such as, for example, epoxy. The encapsulating material 1012 can reduce interference of electromagnetic signals generated by the IC and/or the bonding wires with the electrical signals generated by the MEMS die. In some implementations, the sensor 1000 can be utilized as a microphone, where the sensor 1000 generates electrical signals corresponding to incident sound signals. In some implementations, the sensor 1000 also can be utilized as a pressure sensor, where the sensor 1000 generates electrical signals responsive to pressure changes. In some implementations, the sensor 1000 also can be utilized as an acoustic sensor, where the sensor 1000 generates electrical signals responsive to incident acoustic energy of any level.

In some implementations, at least a portion of the IC 1008 can be embedded into the base 1002. For example, the front surface 1016 of the base can include a cavity, and the IC 1008 can be disposed within the cavity. In some implementations, the cavity can be deeper than a height of the IC 1008, such that a top surface of the IC 1008 lies below the plane of the front surface 1016. In some other implementations, the depth of the cavity can be such that the top surface of the IC 1008 lies above the plane of the front surface 1016.

A cover 1006 is disposed on the front surface 1016 of the base 1002 and covers the MEMS die 1004, the first set of wires 1010, the IC 1008, the second set of wires 1026, and the encapsulating material 1012. The cover 1006 defines a coined or indented region 1020 on an outer surface 1024. The indented region 1020 includes a indented surface 1038 that is offset or in a stepped relation to the outer surface 1024 of the cover 1006. The indented region 1020 can have a thickness $T_2$ that is less than a thickness $T_1$ of the cover 1006. The indented region 1020 defines an opening 1040 that extends between the indented surface 1038 and an inner surface 1022 of the cover 1006. The opening 1040 allows acoustic energy from the outside of the sensor 1000 to enter a front volume 1030 of the sensor 1000 and be incident on the MEMS die 1004. In some implementations, the thickness $T_2$ of the indented region 1020 can be about 10% or more of the thickness $T_1$ of the cover 1006. In some other implementations, the thickness $T_2$ of the indented region can be about 50% to about 70% of the thickness $T_1$ of the cover 1006. In some implementations, the thickness $T_1$ of the cover can be about 75 microns to about 125 microns. In some implementations, the opening 1040 can have at least one dimension that is about 350 microns to about 650 microns in size. For example, the dimensions can include a diameter of the opening 1040, (such as, for example, when the opening 1040 is circular), a diagonal or a side of the opening (such as, for example, when the opening is rectangular or polygonal), or an longitudinal axis of the opening 1040 within the plane of the indented surface 1038 or the inner surface 1022.

A filtering material such as, for example, a mesh 1034 can be disposed over the opening 1040 in the indented surface 1038 of the cover 1006. The mesh 1034 can be acoustically permeable. That is, the mesh 1034 can allow sound energy from the outside of the sensor 1000 to enter the front volume 1030 through the opening 1040 and be incident on the MEMS die 1004. The acoustic permeability of the mesh 1034 can be high, such that the presence of the mesh 1034 does not substantially affect the SNR of the sensor 1000. In some implementations, the acoustic permeability of the mesh 1034 can be selected such that the SNR of the sensor 1000 with the mesh 1034 is no less than about 90% of the SNR of the sensor 1000 without the mesh 1034. The mesh 1034 can include a porous material that allows sound to pass through, but prevents contaminants from entering or ingressing through the opening 1040. The contaminants can include solid particles as well as liquids. In some implementations, the mesh 1034 can include a metal screen with small openings. In some implementations, the mesh 1034 can be configured to provide ingress protection to an extent that is equal to or exceeds the requirements of the International Electrotechnical Commission (IEC) IP67 rating.

In some implementations, the mesh 1034 can be formed of a netting, network, or interlace of a material, which can include, without limitation, a metal, a polymer, a composite, or a combination thereof. In some implementations, the mesh 1034 can include openings that can range from about 1 micron to about 4 micron in size. In some implementations, the material used to form the mesh 1034 can have hydrophobic properties, to prevent liquids from ingressing through the opening 1040. For example, the mesh 1034 can include Teflon, or Teflon-like materials to impart hydrophobic properties. In some implementations, a porous membrane can be utilized instead of, or in addition to, the mesh 1034, where the membrane can have pores with sizes that are similar to those discussed above in relation to the mesh 1034. In addition, the membrane can be made of materials similar to those discussed above in relation to the mesh 1034.

In some implementations, the mesh 1034 can be removably disposed over the opening 1040. For example, the mesh 1034 can be bonded to the indented surface 1038 with an adhesive, such that the adhesive holds the mesh 1034 in place over the opening 1040, but can also allow the mesh 1034 to be pulled and removed from over the opening 1040 when sufficient force is applied. In some implementations, an epoxy can be used to bond the mesh 1034 to the indented surface 1038. In some other implementations, a die-attach can be used to bond the mesh 1034 to the indented surface 1038, such that the mesh 1034 can be removed. The mesh 1034 can be placed on the cover 1006 using a pick-and-place system of a bonder. The adhesive can be applied to the cover 1006, on the mesh 1034 or both the cover 1006 and the mesh 1034 before the mesh 1034 is placed on the cover 1006. The mesh 1034 can be removeable and replaceable, such that once removed the mesh 1034 can be replaced with another mesh or filtering material.

In some implementations, a depth of the indented region 1020 can be greater than a thickness of the mesh 1034. Specifically, the depth of the region can be defined by a difference between the thickness $T_1$ of the cover 1006 and the thickness $T_2$ of the indented region 1020. Having the depth of the indented region 1020 to be greater than the thickness of the mesh 1034 allows the mesh 1034 to lie completely within the indented region 1020, thereby protecting the mesh 1034 by reducing the risk of contact between the mesh 1034 and other surfaces near the sensor 1000. Alternatively, the depth of the indented region 1020 can be less than the thickness of the mesh 1034.

Figure 11:
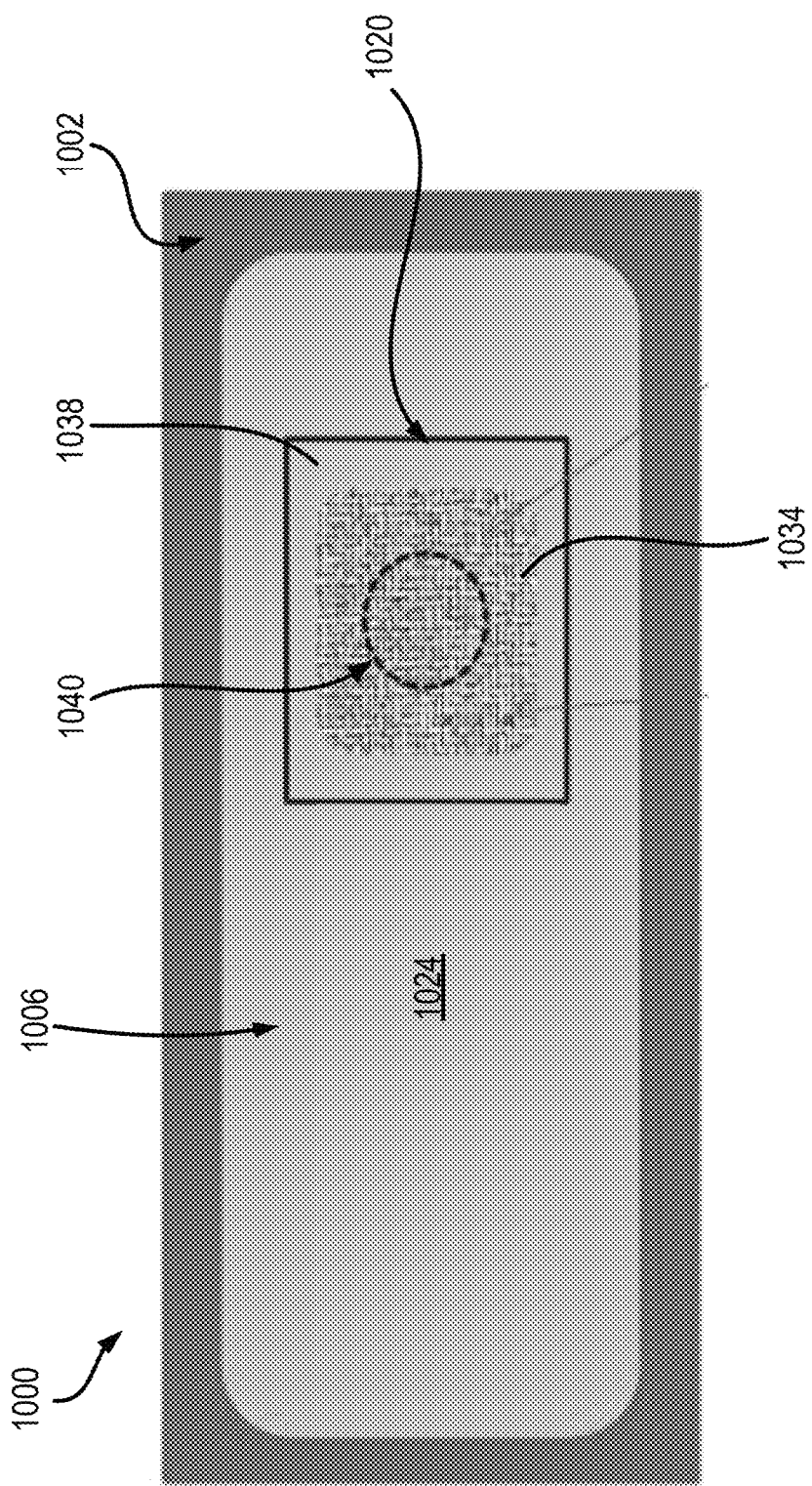
FIG. 11 shows a top view of the sensor device shown in FIG. 10.

FIG. 11 shows a top view of the sensor 1000 shown in FIG. 10. FIG. 11 shows a boundary of the coined or indented region 1020 formed in the cover 1006. The indented region 1020 is surrounded by the outer surface 1024 of the cover 1006. The dimensions of the mesh 1034, within the plane of the outer surface 1024, can be smaller than the corresponding dimensions of the indented region 1020. The shape of the mesh 1034, which is substantially rectangular, can be similar to the shape of the indented region 1020. Alternatively, the shape of the mesh 1034 can be different from the shape of the indented region 1020. For example, the shape of the mesh 1034 can be circular or elliptical, while the shape of the indented region 1020 can be rectangular. The shape of the mesh 1034 can be any shape such as circular, elliptical, or a regular or irregular polygonal shape. The opening 1040, which lies under the mesh 1034 is shown in broken lines.

Figure 12:
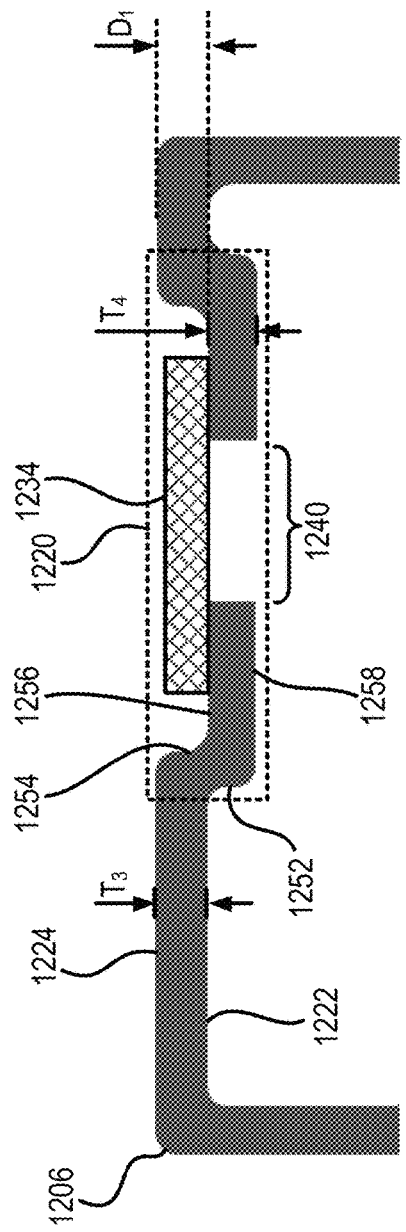
FIG. 12 shows a cut-away view of an example cover having an inward drawn region that can be used in the sensor shown in FIG. 10 in accordance with an illustrative embodiment.

FIG. 12 shows a cut-away view of an example cover 1206 that can be used in the sensor 1000 shown in FIG. 10 in accordance with an illustrative embodiment. In particular, the cover 1206 can be used instead of the cover 1006 shown in FIG. 10. The cover 1206 includes an outer surface 1224 and an inner surface 1222. While not shown in FIG. 12, the cover 1206 can be positioned on a front surface, such as the front surface 1016 shown in FIG. 10, of a base to enclose the components of the sensor. The cover 1206 also includes an inward drawn region 1220, which forms a depression in the cover 1206. The inward drawn region 1220 includes a drawn region outer surface 1256 that lies in a plane inward from a plane of the outer surface 1224. An outer sidewall surface 1254 extends between a periphery of the drawn region outer surface 1256 and a periphery of the outer surface 1224. The inward drawn region 1220 also includes a drawn region inner surface 1258, which lies in a plane that is different from a plane of the inner surface 1222. An inner sidewall surface 1252 extends between a periphery of the drawn region inner surface 1258 and a periphery of the inner surface 1222. The outer sidewall surface 1254 and the inner sidewall surface 1252 can be substantially planar. Alternatively, the outer sidewall surface 1254 and the inner sidewall surface 1252 can have a curved shape.

The inward drawn region 1220 defines an opening 1240 which extends between the drawn region outer surface 1256 and the drawn region inner surface 1258. The opening 1240 can provide a port for acoustic energy from outside of the sensor to enter a front volume of the sensor and be incident on the MEMS die. The drawn region outer surface 1256 can support a filter material such as, for example, a mesh 1234. The mesh 1234 can be similar to the mesh 1034 discussed above in relation to FIG. 10. The mesh 1234 can provide resistance to the ingression of solid particles and liquids through the opening 1240.

Figure 13:
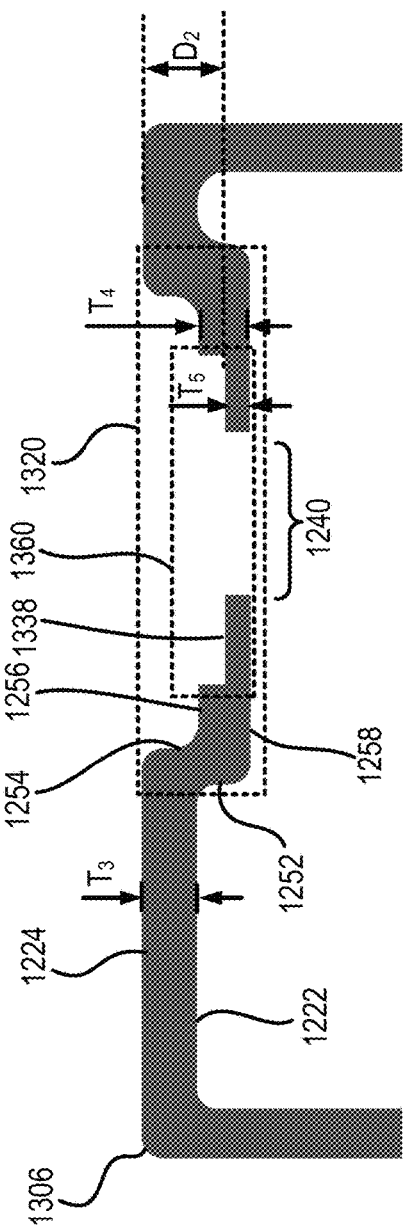
FIG. 13 shows a cut-away view of another example cover having an inward drawn region and in indented region that can be used in the sensor shown in FIG. 10 in accordance with an illustrative embodiment.

The thickness $T_4$ of the inward drawn region 1220, as measured between the drawn region outer surface 1256 and the drawn region inner surface 1258 can be substantially equal to the thickness $T_3$ of the remainder of the cover 1206, as measured between the outer surface 1224 and the inner surface 1222. In some implementations, the thickness $T_4$ can be less than the thickness $T_3$. In yet other implementations, the thickness $T_4$ can be greater than the thickness $T_3$. In some implementations, the thickness $T_3$ can be about 75 microns to about 125 microns, or about 100 microns. In some implementations, the thickness $T_4$ can be about 75 microns to about 125 microns, or about 100 microns. A depth $D_1$ of the inward drawn region 1220 can be defined by a distance between the plane of the outer surface 1224 and the plane of the drawn region outer surface 1256. In some implementations, the depth $D_1$ can be substantially equal to the thickness of the mesh 1234, resulting in the surface of the mesh 1234 being substantially coplanar with the plane of the outer surface 1224. That is, the surface of the mesh 1234 can be flush with the outer surface 1224. In some other implementations, the depth $D_1$ can be greater than the thickness of the mesh 1234. This can allow the mesh 1234 to be disposed completely within the inward drawn region 1220, reducing the risk of scratches or other damage to the mesh 1234. In yet other implementations, the depth $D_1$ can be less than the thickness of the mesh 1234. In some implementations, the depth $D_1$ can be about 75 microns to about 125 microns, or about 40 microns to about 80 microns, or about 60 microns. FIG. 13 shows a cut-away view of another example cover 1306 that can be used in the sensor 1000 shown in FIG. 10 in accordance with an illustrative embodiment. The cover 1306, similar to the cover 1206 shown in FIG. 12, also includes an inward drawn region 1320, which forms a depression in the cover 1306. To the extent that some features of the inward drawn region 1320 shown in FIG. 13 are similar to those of the inward drawn region 1220 shown in FIG. 2, such features are referred to with common reference numerals. The inward drawn region 1320 also includes an indented region 1360. The indented region is similar to the indented region 1020 shown in FIG.10. However, unlike the indented region 1020 shown in FIG. 10, in which the indented surface 1038 is offset or in a stepped relation to the outer surface 1024 of the cover 1006, an indented surface 1338 of the indented region 1360 is offset or is in a stepped relation to the drawn region outer surface 1256. The opening 1240 extends between the drawn region inner surface 1258 and the indented surface 1338. While not shown in FIG. 13, the indented surface 1338 can support a filtering material, such as, for example, a mesh. The mesh can be similar to the mesh 1234 shown in FIG. 12. In some implementations, the filtering material, such as the mesh 1234 can be placed over the drawn region outer surface 1256, instead of on the indented surface 1338. That is, a lower surface of the mesh 1234 can be bonded to the drawn region outer surface 1256, without making contact with the indented surface 1258. This is similar to that shown in FIG. 12, where the mesh 1234 is bonded to the drawn region outer surface 1256, but results in a larger area of the mesh 1234 being exposed. Having a larger area of the mesh 1234 being exposed can reduce the acoustic impedance of the mesh 1234.

The indented region 1360 can have a thickness $T_5$ defined by a distance between a plane of the indented surface 1338 and the drawn region inner surface 1258. In some implementations, the thickness $T_5$ can be less than the thickness $T_4$ and the thickness $T_3$. For example, the thickness $T_5$ can be about 50% to about 70% or about 60% of the thickness $T_4$. The inward drawn region 1320 can have a depth $D_2$ defined by a distance between a plane of the outer surface 1224 and a plane of the indented surface 1338. In some implementations, the depth $D_2$ can be substantially equal to the thickness of the mesh, such that the outer surface of the mesh is coplanar or is flush with the outer surface 1224. In some other implementations, the depth $D_2$ can be greater than the thickness of the mesh, such hat the mesh is disposed within the inward drawn region 1320. In yet other implementations, the depth $D_2$ can be less than the thickness of the mesh. Including the indented region 1360 can allow the depth $D_2$ to be greater than the depth $D_1$, shown in FIG. 12, without having to increase an overall depth of the inward drawn region 1320 as measured between the planes of the inner surface 1222 and the drawn region inner surface 1258. As a certain amount of clearance between the drawn region inner surface 1258 and the inner components of the sensor is desired, an increase in the overall depth of the inward drawn region 1320 may have to be compensated by increasing a height of the cover 1306, which, in turn, may result in an increase in the size of the sensor. By incorporating the indented region 1360, additional depth can be provided at the outer surface of the drawn region without having to increase the height of the cover 1306. In some implementations, the depth $D_2$ can be about 100 microns to about 200 microns, or about 150 microns.

Figure 14:
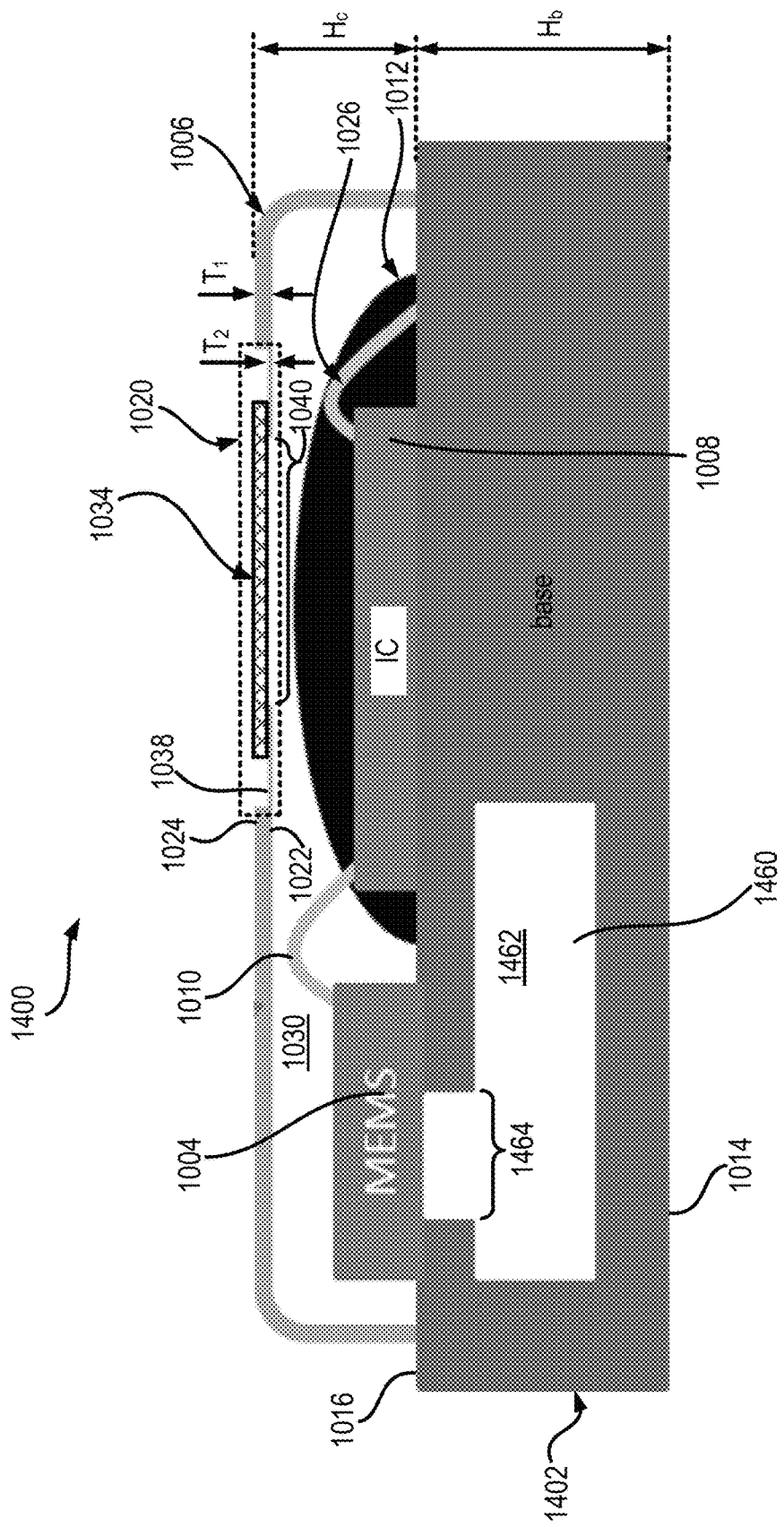
FIG. 14 shows a cut-away view of a top port sensor with a mesh positioned within a coined area on a top surface of a lid and including a cavity in a base in accordance with an illustrative embodiment.

FIG. 14 shows a cut-away view of a top port sensor 1400 with a mesh positioned within a coined area on a top surface of a lid and including a cavity in a base in accordance with an illustrative embodiment. In many respects, the sensor 1400 is similar to the sensor 1000 shown in FIG. 10. To that extent, features common to both the sensor 1400 shown in FIG. 14 and the sensor 1000 shown in FIG. 10 are referred to with the same reference numerals. In contrast to the base 1002 shown in FIG. 10, a base 1402 of the sensor 1400 shown in FIG. 14 includes a cavity 1460 defined within the base 1402 between the front surface 1016 and the back surface 1014. The base 1402 also defines a cavity opening 1464 between the cavity 1460 and the front surface 1016. The cavity opening 1464 is positioned under the MEMS die 1004, such that the MEMS die 1004 is in fluid communication with the cavity 1460. The sum of the volumes of the cavity 1460, the cavity opening 1464 and the MEMS die 1004 defines a back volume 1462 of the sensor 1400. The magnitude of the back volume 1462 can affect the frequency response characteristics of the sensor 1400. To that end, the size of the cavity 1460 can be selected to achieve the desired frequency response characteristics.

A height $H_c$ of the cover 1006, measured as a distance between the outer surface 1024 of the cover 1006 and the front surface 1016 of the base 1402 can be less than a height $H_b$ of the base 1402, measured as a distance between the back surface 1014 and the front surface 1016 of the base 1402. In some implementations, the height $H_c$ of the cover 1006 can be at least about 500 microns, and the height $H_b$ of the base can be at least about 250 microns. In some implementations, the combined heights ($H_c+H_b$) of the cover 1006 and the base 1402 can be about 0.75 mm to about 2.25 mm or about 1.5 mm. In some implementations, the cover 1006 shown in FIG. 14 can be replaced with any one of the covers 1206 and 1306 discussed above in relation to FIGS. 12 and 13 above.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A sensor comprising:
   a base having a first surface and an opposing second surface;
   a microelectromechanical system (MEMS) die mounted to the first surface of the base;
   an integrated circuit (IC) disposed on the base;
   a cover disposed over the first surface of the base covering the MEMS die and the IC, the cover having an outer surface and an inner surface, the outer surface of the cover defining an indented region having an indented surface, the cover defining a top port extending between the indented surface and the inner surface, wherein a distance between the indented surface and the inner surface of the cover is less than a distance between the outer surface of the cover and the inner surface of the cover; and
   a filtering material disposed on the indented surface covering the top port, the filtering material structured to prevent ingress of contaminants through the top port.

2. The sensor of claim 1, wherein a depth of the indented region is greater than a thickness of the filtering material.

3. The sensor of claim 1, wherein a depth of the indented region is substantially equal to a thickness of the filtering material such that an outer surface of the filtering material is substantially coplanar with the outer surface of the cover.

4. The sensor of claim 1, wherein the filtering material includes a mesh filter.

5. The sensor of claim 1, wherein the base defines a cavity disposed between the first surface and the second surface of the base and an opening disposed under the MEMS die, the opening extending between the cavity and the first surface of the base.

6. The sensor of claim 1, wherein the integrated circuit is mounted on the first surface of the base.

7. The sensor of claim 1, wherein at least a portion of the integrated circuit is embedded into the base.

8. The sensor of claim 1, wherein the sensor is at least one of a microphone, a pressure sensor, or an acoustic sensor.

9. The sensor of claim 1, wherein the filtering material is removably disposed on the indented surface.

10. The sensor of claim 1, wherein the filtering material includes a replaceable mesh filter.

11. A sensor comprising:
a base having a first surface and an opposing second surface;
a microelectromechanical system (MEMS) die mounted to the first surface of the base;
an integrated circuit (IC) disposed on the base;
a cover disposed over the first surface of the base covering the MEMS die and the IC, the cover having an outer surface and an inner surface, the cover further defining an inwardly drawn region forming a depression in the cover, the inwardly drawn region defining a top port, wherein the inwardly drawn region includes a drawn region outer surface and a drawn region inner surface, wherein the top port extends between the drawn region outer surface and the drawn region inner surface; and
a filtering material disposed in the inwardly drawn region and covering the top port, the filtering material structured to prevent ingress of contaminants through the top port.

12. The sensor of claim 11, wherein the inwardly drawn region includes a first sidewall extending between the drawn region inner surface and the inner surface of the cover, and a second sidewall extending between the drawn region outer surface and the outer surface of the cover.

13. The sensor of claim 11, wherein a distance between a plane of the outer surface and a plane of the drawn region outer surface is greater than a thickness of the filtering material.

14. The sensor of claim 11, wherein a distance between a plane of the outer surface and a plane of the drawn region outer surface is substantially equal to a thickness of the filtering material.

15. The sensor of claim 11, wherein the drawn region outer surface defines an indented region having an indented surface, and wherein the top port extends between the indented surface and the drawn region inner surface.

16. The sensor of claim 15, wherein the filtering material is disposed on the indented surface.

17. The sensor of claim 16, wherein the filtering material is removably disposed on the indented surface.

18. The sensor of claim 16, wherein the filtering material includes a replaceable mesh filter.

19. The sensor of claim 16, wherein a distance between a plane of the indented surface and a plane of the outer surface of the cover is greater than a thickness of the filtering material.

20. The sensor of claim 16, wherein a distance between a plane of the indented surface and a plane of the outer surface of the cover is substantially equal to a thickness of the filtering material.

21. The sensor of claim 11, wherein the filtering material is disposed on the drawn region outer surface.

22. The sensor of claim 11, wherein the filtering material includes a mesh filter.

23. The sensor of claim 11, wherein the integrated circuit is mounted on the first surface of the base.

24. The sensor of claim 11, wherein the integrated circuit is embedded into the base.

25. The sensor of claim 11, wherein the base defines a cavity disposed between the first surface and the second surface of the base, and an opening disposed under the MEMS die, the opening extending between the cavity and the first surface of the base.

26. The sensor of claim 11, wherein the sensor is at least one of a microphone, a pressure sensor, or an acoustic sensor.

27. A sensor comprising:
a base having a first surface and an opposing second surface;
a microelectromechanical system (MEMS) die mounted to the first surface of the base;
an integrated circuit (IC) disposed on the base;
a cover disposed over the first surface of the base covering the MEMS die and the IC, the cover having a top surface, the cover further having a bottom surface facing the base, the bottom surface of the cover defining an indented portion having an indented surface, wherein a distance between the indented surface and the top surface of the cover is less than a distance between the bottom surface of the cover and the top surface of the cover, the cover defining a top port within the indented portion; and
a mesh screen disposed within the indented portion and positioned to cover the top port, the mesh screen structured to prevent ingress of particles through the top port.

28. The sensor of claim 27, wherein the mesh screen is flush with the bottom surface.

29. The sensor of claim 27, wherein the indented portion does not extend completely through the cover.

30. The sensor of claim 27, wherein the sensor is at least one of a microphone, a pressure sensor, or an acoustic sensor.

* * * * *